(12) United States Patent  
Kaneda et al.

(10) Patent No.: US 7,705,398 B2  
(45) Date of Patent: Apr. 27, 2010

(54) SEMICONDUCTOR DEVICE PREVENTING RECOVERY BREAKDOWN AND MANUFACTURING METHOD THEREOF

(75) Inventors: Mitsuru Kaneda, Chiyoda-ku (JP); Hideki Takahashi, Chiyoda-ku (JP); Yoshifumi Tomomatsu, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 196 days.

(21) Appl. No.: 11/617,863

(22) Filed: Dec. 29, 2006

(65) Prior Publication Data

US 2008/0093697 A1    Apr. 24, 2008

(30) Foreign Application Priority Data

Oct. 20, 2006   (JP)   ............................. 2006-285863

(51) Int. Cl.
   *H01L 29/76*   (2006.01)
(52) U.S. Cl. .............................. 257/341; 257/E29.027; 257/E29.013
(58) Field of Classification Search .......... 257/E29.027, 257/E29.013, 341, 127, 127 TD
   See application file for complete search history.

(56) References Cited

U.S. PATENT DOCUMENTS

| | | | |
|---|---|---|---|
| 5,066,995 A | | 11/1991 | Young et al. |
| 5,070,377 A | * | 12/1991 | Harada ........................ 257/336 |
| 5,105,244 A | * | 4/1992 | Bauer ......................... 257/138 |
| 5,608,236 A | | 3/1997 | Arakawa et al. |
| 5,969,400 A | | 10/1999 | Shinohe et al. |
| 6,838,321 B2 | | 1/2005 | Kaneda et al. |
| 6,864,545 B2 | | 3/2005 | Yamashita |
| 2002/0100935 A1 | * | 8/2002 | Inoue ......................... 257/341 |
| 2005/0017290 A1 | * | 1/2005 | Takahashi et al. ........... 257/328 |
| 2005/0258493 A1 | * | 11/2005 | Aono et al. .................. 257/370 |

FOREIGN PATENT DOCUMENTS

| | | |
|---|---|---|
| DE | 10 2004 040 997 A1 | 3/2005 |
| JP | 5-152574 | 6/1993 |
| JP | 6-85269 | 3/1994 |
| JP | 7-153942 | 6/1995 |
| KR | 1997-0004060 | 1/1997 |
| KR | 10-2004-0079893 | 9/2004 |
| KR | 10-2004-0083077 | 9/2004 |

\* cited by examiner

*Primary Examiner*—Thomas L Dickey  
(74) *Attorney, Agent, or Firm*—Oblon, Spivak, McClelland, Maier & Neustadt, L.L.P.

(57) ABSTRACT

A second impurity region is surrounded by a first impurity region at a first main surface. A third impurity region of the first main surface sandwiches the second impurity region with the first impurity region. Fourth and fifth impurity regions of a second main surface sandwich the first impurity region with the second impurity region. A control electrode layer is opposite to the second impurity region with an insulating film interposed. That portion of the second main surface which is opposite to the portion of the first main surface where the first impurity region is formed surrounds the regions for forming the fourth and fifth impurity regions of the second main surface, and it is a region of the first conductivity type or a region of the second conductivity type having impurity concentration not higher than that of the first impurity region.

8 Claims, 11 Drawing Sheets

14 15 14 15 14
(IG) (DD) (IG) (DD) (IG)
(CL)

11
(42P)
(PR)

42

SEMICONDUCTOR DEVICE PREVENTING RECOVERY BREAKDOWN AND MANUFACTURING METHOD THEREOF

BACKGROUND OF THE INVENTION

1. Field of the Invention

The present invention relates to a semiconductor device and manufacturing method thereof.

2. Description of the Background Art

Recently, in view of saving energy, an inverter circuit has come to be widely used for controlling home electric appliances and industrial power apparatuses. In an inverter circuit, power control is effected by repeating on and off of voltage or current, using a power semiconductor device. When rated voltage is 300 V or higher, an insulated gate bipolar transistor (IGBT) is mainly used, considering its characteristics.

It is often the case that the inverter circuit drives an inductive load such as an induction motor. In that case, back electromotive force generates from the inductive load. Therefore, a free wheel diode for circulating a current generated by the back electromotive force opposite in direction to the main current of IGBT, becomes necessary.

A common inverter circuit having an IGBT and the free wheel diode as separate parts connected in parallel has been used. In order to reduce size and weight of the inverter device, however, a semiconductor device having the IGBT and the free wheel diode integrated as one chip has been developed.

Conventionally, a semiconductor device having the IGBT and the free wheel diode integrated as one chip as described above has been proposed, for example, in Japanese Patent Laying-Open Nos. 05-152574, 06-085269 and 07-153942.

When the free wheel diode of the semiconductor device described above is in a forward conductive state, a large number of carriers for carrying current are stored in the semiconductor device. Therefore, immediately after switching of the current to the reverse direction, a phenomenon in which a large current flows instantaneously in the reverse direction (recovery operation) occurs.

According to the conventional art described above, in the recovery operation, a current may possibly flow to cause carriers stored in a region around an outer periphery of IGBT and free wheel diode forming regions (cell region) to concentrate at an end portion of the cell region, causing breakdown of the semiconductor device (recovery breakdown).

When recovery breakdown occurs, the semiconductor device can no longer function well as an IGBT or a free wheel diode, because, for example, a simple resistor in electric equivalence is formed between electrodes. Further, failure such as melting of metal electrode may sometimes be observed. Crystal structure analysis of the end portion of cell region sometimes reveals destruction of original single-crystal structure.

It is noted that the longer the carrier life time in a semiconductor device, the larger the current that flows in the recovery operation, and the higher the possibility of recovery breakdown. Though the carrier life time can be made shorter by electron beam irradiation, for example, such an additional process step increases manufacturing cost.

SUMMARY OF THE INVENTION

The present invention was made in view of the problems described above, and its object is to provide a semiconductor device capable of preventing recovery breakdown by suppressing current flowing to cause carriers stored in an outer peripheral region of the cell region to concentrate at an end portion of the cell region in a recovery operation, and to provide a manufacturing method thereof.

The semiconductor device according to the present invention includes a semiconductor substrate, a second impurity region of a second conductivity type, a third impurity region of a first conductivity type, a fourth impurity region of the second conductivity type, a fifth impurity region of the first conductivity type, and a control electrode layer. The semiconductor substrate has first and second main surfaces, and includes a first impurity region of the first conductivity type. The second impurity region is formed in the first main surface of the semiconductor substrate and surrounded in the first main surface by the first impurity region. The third impurity region is formed in the first main surface and sandwiches the second impurity region with the first impurity region. The fourth impurity region is selectively formed in the second main surface of the semiconductor substrate, and sandwiches the first impurity region with the second impurity region. The fifth impurity region is selectively formed in the second main surface of the semiconductor substrate, sandwiches the first impurity region with the second impurity region, and has higher impurity concentration than the first impurity region. The control electrode is formed to be opposite to the second impurity region sandwiched between the first and third impurity regions, with an insulating film interposed. That portion of the second main surface which is opposite to the portion of the first main surface where the first impurity region is formed surrounds regions for forming the fourth and fifth impurity regions on the second main surface, and it is either a region of the first conductivity type having a concentration not higher than the impurity concentration of the first impurity region or the second conductivity type.

The method of manufacturing a semiconductor device in accordance with the present invention includes the following steps.

First, by selectively introducing an impurity to a first main surface of a semiconductor substrate having first and second main surfaces and a first impurity region of a first conductivity type, a second impurity region of a second conductivity type surrounded by the first impurity region in the first main surface is formed. A third impurity region of the first conductivity type is formed in the first main surface, to sandwich the second impurity region with the first impurity region. A control electrode layer is formed to be opposite to the second impurity region sandwiched between the third and first impurity regions, with an insulating film interposed. A fourth impurity region of the second conductivity type is selectively formed in the second main surface. A fifth impurity region of the first conductivity type having higher impurity concentration than the first impurity region is selectively formed at that portion of the second main surface which is opposite to the second impurity region.

In the semiconductor device and manufacturing method thereof according to the present invention, that portion of the second main surface which is opposite to the portion of the first main surface of the semiconductor substrate where the first impurity region is formed surrounds regions for forming the fourth and fifth impurity regions of the second main surface, and it is either a region of the first conductivity type having a concentration not higher than the impurity concentration of the first impurity region or the second conductivity type. Specifically, that portion of the second main surface which is opposite to the portion where the first impurity region is formed on the first main surface does not have any region of the first conductivity type of higher concentration than the first impurity region.

Therefore, when the diode is in a forward conductive state, supply of carriers from the portion of the second main surface reduces. As a result, carriers stored in the outer peripheral region of the cell region decrease. Thus, the current that concentrates to the end portion of the cell region in a recovery operation becomes smaller, preventing recovery breakdown of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the drawings.

First Embodiment

First, the structure of the semiconductor device in accordance with the present embodiment will be described with reference to FIGS. 1 to 4.

Figure 1:
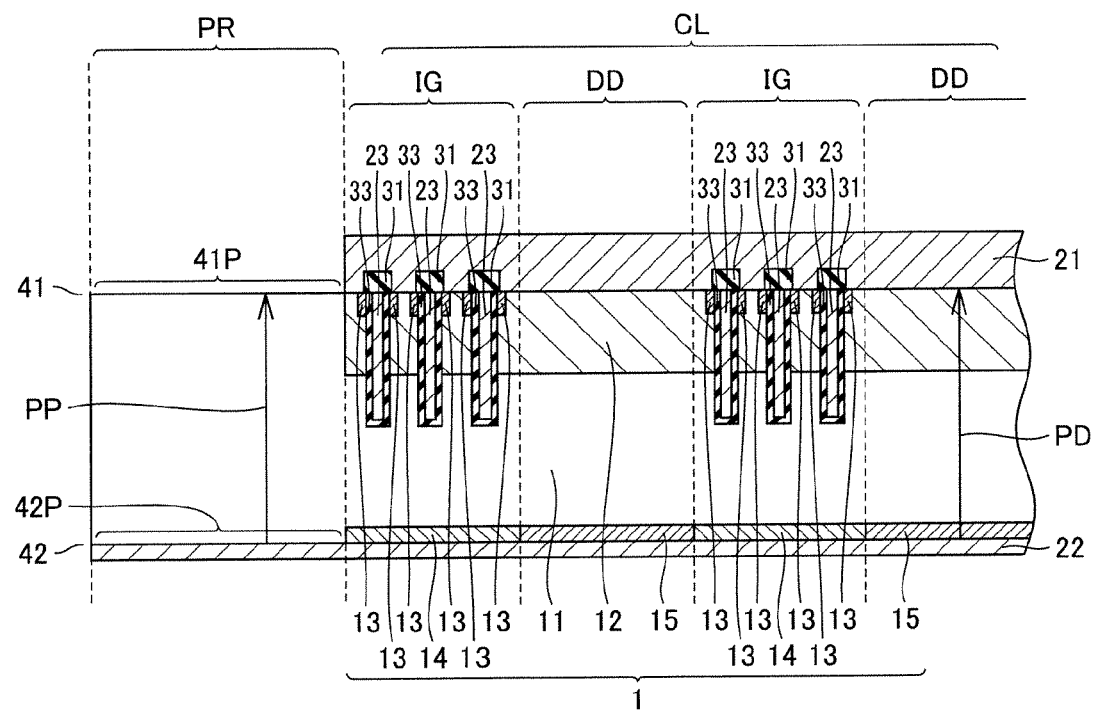
FIG. 1 is a partial cross-sectional view schematically showing a structure of a semiconductor device in accordance with a first embodiment of the present invention, taken along a line I-I of FIGS. 2 and 3.

Mainly referring to FIG. 1, the semiconductor device in accordance with the present invention has an IGBT and a free wheel diode formed in a semiconductor substrate 1.

The IGBT is formed in an IGBT forming region IG, and has an $n^-$ region (first impurity region) 11, a p type region (second impurity region) 12, an $n^+$ emitter region (third impurity region) 13, a p type collector region (fourth impurity region) 14, a gate electrode layer (control electrode layer) 23, and an insulating film 33.

The $n^-$ region 11 is included in the semiconductor substrate 1 having a first main surface 41 and a second main surface 42.

Figure 2:
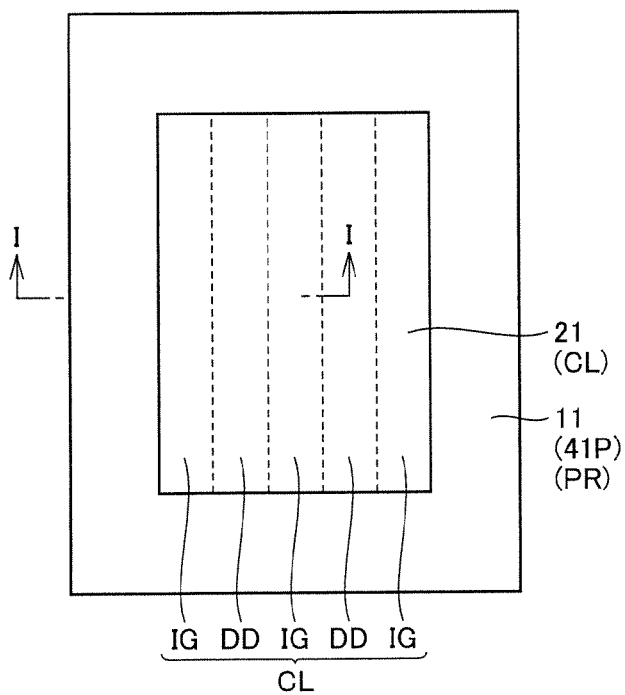
FIG. 2 is a top view schematically showing a structure of the semiconductor device in accordance with the first embodiment of the present invention.

The p type region 12 is formed in the first main surface 41 of semiconductor substrate 1. Further, as shown in FIG. 2, an outer peripheral portion of the first main surface 41 of semiconductor substrate 1 is the $n^-$ region 11. Therefore, at the first main surface 41, p-type region 12 is surrounded by outer peripheral surface 41P as the $n^-$ region 11.

The $n^+$ emitter region 13 is formed surrounded by p type region 12 at the first main surface 41 of semiconductor substrate 1. The $n^+$ emitter region 13 sandwiches, with $n^-$ region 11, the p type region 12.

Figure 3:
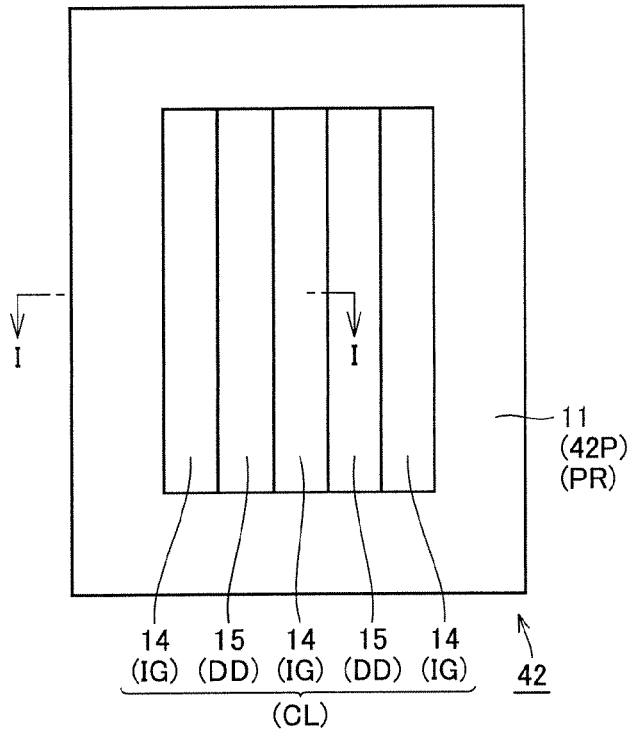
FIG. 3 is a bottom view schematically showing a structure of the semiconductor device in accordance with the first embodiment of the present invention, with the second electrode layer omitted.

The p type collector region 14 is selectively formed in the second main surface 42. The p type collector region 14 sandwiches $n^-$ region 11 with p type region 12. As shown in FIG. 3, the outer peripheral portion of the second main surface 42 of the semiconductor substrate is $n^-$ region 11. Therefore, at the second main surface 42, p type collector region 14 is surrounded by $n^-$ region 11.

Gate electrode layer 23 is formed in a trench provided in the first main surface 41 of semiconductor substrate 1, with an insulating film 33 interposed. Gate electrode layer 23 is opposite to p type region 12 sandwiched between $n^-$ region 11 and $n^+$ emitter region 13, with an insulating film 33 interposed.

The free wheel diode is formed in a diode region DD, and has an $n^-$ region 11, a p type region 12 and an n type cathode region (fifth impurity region) 15.

The $n^-$ region 11 and p type region 12 are shared between diode region DD and IGBT region IG. The $n^-$ region 11 is, as described above, the region included in semiconductor substrate 1. The p type region 12 is formed in the first main surface 41 of semiconductor substrate 1.

The n type cathode region 15 is selectively formed in the second main surface 42. The n type cathode region 15 sandwiches $n^-$ region 11 with p type region 12. Further, as shown in FIG. 3, the outer peripheral portion of the second main surface 42 of the semiconductor substrate is the $n^-$ region 11. Therefore, at the second main surface 42, p type collector region 14 is surrounded by $n^-$ region 11.

On the first main surface 41 of semiconductor substrate 1, an insulating film 31 is formed to cover gate electrode layer 23. On insulating film 31, a first electrode layer 21 is formed on the first main surface 41 of semiconductor substrate 1. The first electrode layer 21 is in contact with p type region 12 and $n^+$ emitter region 13 in IGBT region IG, and is in contact with p type region 12 in diode region DD. On outer peripheral surface 41P, the first electrode layer 21 is not formed.

On the second main surface 42 of semiconductor substrate 1, a second electrode layer 22 is formed. The second electrode layer 22 is in contact with p type collector region 14 in IGBT region IG, and is in contact with n type cathode region 15 in diode region DD.

In IGBT region IG, n+ emitter region 13 and n− region 11 serve as source/drain regions, and gate electrode layer 23 may control an n channel of p type region 12. Therefore, IGBT region IG has a structure of a field effect transistor. Further, IGBT region IG has a pnp transistor structure including p type collector region 14, n− region 11 and p type region 12, and base current thereof is controlled by the field effect transistor mentioned above. Therefore, the IGBT region IG may function as the IGBT. When the semiconductor device of the present embodiment functions as the IGBT, the first electrode layer 21 corresponds to the emitter electrode, the second electrode layer 22 corresponds to the collector electrode, and the gate electrode layer 23 corresponds to the gate electrode.

In the diode region DD, p type region 12 is a p type region and n type cathode region 14 and n− region 11 are n type regions. Therefore, diode region DD has a pn junction structure, and hence, diode region DD may function as a diode. When the semiconductor device in accordance with the present embodiment functions as a diode, the second electrode layer 21 corresponds to the anode electrode and the second electrode layer 22 corresponds to the cathode electrode.

The IGBT and diode regions IG and DD are arranged alternately, and the regions where the plurality of IGBT regions and diode regions DD are formed constitute, as a whole, a cell region CL. Around the cell region CL, an outer peripheral region PR is formed. At the boundary between cell region CL and outer peripheral region PR, an outer edge of p type region 12, which is the p type region electrically connected to the first electrode layer 21, is positioned.

At an opposite surface 42P, which is a portion of the second main surface 42 opposite to the portion of the first main surface 41 where outer peripheral region PR is positioned (outer peripheral surface 41P) of semiconductor substrate 1, n− region 11 is formed. Referring to FIG. 1, the portion of the second main surface 42 opposite to outer peripheral portion 41P refers to the portion of second main surface 42 that is positioned in a direction orthogonal to the first main surface 41 from the outer peripheral surface 41P.

Opposite surface 42P is a region surrounding IGBT region IG and diode region DD at the second main surface 42. Therefore, opposite surface 42P surrounds, on the second main surface 42, p type collector region 14 and n type cathode region 15.

The portion of second main surface 42 opposite to n+ emitter region 13 is p type collector region 14. Referring to FIG. 1, the portion of the second main surface 42 opposite to n+ emitter region 13 refers to the portion of the second main surface 42 positioned in a direction orthogonal to the first main surface 41 from n+ emitter region 13.

Further, the portion of first main surface 41 opposite to n type cathode region 15 is p type region 12. Referring to FIG. 1, the portion of the first main surface 41 opposite to n type cathode region 15 refers to the portion of first main surface 41 positioned in a direction orthogonal to the second main surface 42 from n type cathode region 15.

Both p type collector region 14 and n type cathode region 15 extend in the same direction (lengthwise direction in FIG. 3) in the second main surface 42. Further, p type collector region 14 and n type cathode region 15 are each divided into a plurality of regions, and in a direction perpendicular to the direction of extension of p type collector region 14 and n type cathode region 15, the p type collector regions 14 and n type cathode regions 15 are arranged alternately. At opposite ends of the arrangement, p type collector regions 14 are positioned, and therefore, n type cathode regions 15 in the arrangement above are positioned sandwiched between p type collector regions 14.

An impurity introduced in the thickness direction (arrow PP of FIG. 1) from opposite surface 42P to outer peripheral surface 41P of semiconductor substrate 1 to attain n type conductivity in semiconductor substrate 1 has almost constant concentration, of which average value is $N_1$. Here, "almost constant" means the impurity concentration is within ±10% from the average impurity concentration $N_1$.

Figure 4:
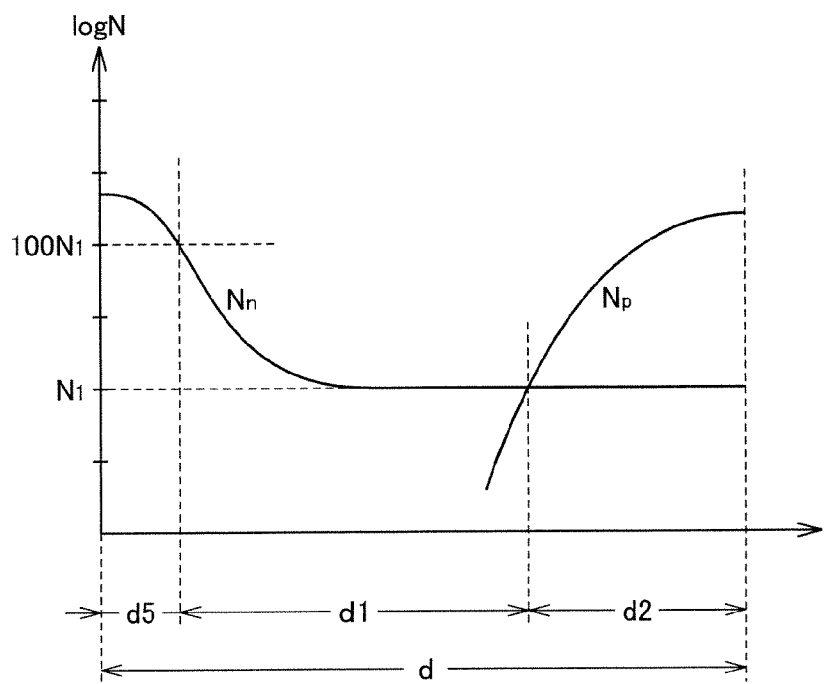
FIG. 4 is a graph of an impurity concentration profile taken along an arrow PD of FIG. 1.

An impurity concentration profile in the thickness direction (arrow PD of FIG. 1) from n type cathode region 15 to p type region 12 of semiconductor substrate 1 has thickness dependency as shown in FIG. 4. Referring to FIGS. 1 and 4, the origin of the graph showing the profile corresponds to the position of the tail end of arrow PD (FIG. 1) in the second main surface 42. Of the thickness d of semiconductor substrate 1, within the range of thickness d5 from the position of second main surface 42, n type cathode region 15 is formed, which is a region having impurity concentration $N_n$ to attain n type conductivity in semiconductor substrate 1 significantly higher than n− region 11. Here, "significantly higher" means $N_n \geq 100 N_1$.

At a region further by at least d5 from the second main surface 42, impurity concentration $N_n$ to attain n type conductivity in semiconductor substrate 1 is approximately constant. Here, "approximately constant" means that the impurity concentration $N_n$ is in the range of $0.9 N_1 \leq N_n < 100 N_1$.

In the range of thickness d2 from the first main surface 41, p type region 12 is formed, in which an impurity concentration $N_p$ to attain p type conductivity in semiconductor substrate 1 is higher than $N_n$.

Next, function of each region of the semiconductor device in accordance with the present embodiment will be described with reference to FIGS. 1 to 5.

An ON operation of the IGBT will be described. Between the first electrode layer 21 and the second electrode layer 22, a positive collector voltage $V_{CE}$ is applied. In this state, a prescribed positive gate voltage $V_{GE}$ is applied between the first electrode layer 21 and gate electrode layer 23, so that the gate is turned on. At this time, the channel region of p type region 12 is inverted from the p type to the n type, forming a channel. Through the channel, electrons are introduced from the first electrode layer 21 to n− region 11. By the introduced electrons, p type collector region 14 and n− region 11 are set to a forward biased state, and holes are introduced from p type collector region 14 to n− region 11. Consequently, resistance in n− region 11 significantly lowers (a so-called conductivity modulation), on-resistance of IGBT significantly decreases, and current capacity increases.

Next, an OFF operation of the IGBT (turn off) will be described. In the on state, positive gate voltage $V_{GE}$ is being applied between the first electrode layer 21 and gate electrode layer 23. When the gate voltage $V_{GE}$ is set to zero or to a negative value (reverse biased), the region that has been reversed to the n type in p type region 12 returns to the p type, and introduction of electrons from the first electrode region 21 to n− region 11 stops. Accordingly, introduction of holes from p type collector region 14 to n− region 11 also stops. Thereafter, the electrons and holes that have been stored in n− region 11 are recovered to the second electrode layer 22 and the first electrode layer 21, respectively, or re-combined with each other, and disappear.

Diode region DD has a pn structure consisting of p type region 12 and n type regions including n− region 11 and n type cathode region 15. Thus, diode region DD may function as a diode. When the semiconductor device functions as a diode, the first electrode layer 21 corresponds to the anode electrode and the second electrode layer 22 corresponds to the cathode electrode.

IGBT region IG and diode region DD share the first and second electrode layers 21 and 22. As a result, a circuit having IGBT and a diode connected in parallel is formed equivalently between the first and second electrode layers 21 and 22. Specifically, the semiconductor device in accordance with the present invention has a function of a circuit having IGBT and free wheel diode connected in parallel. It is noted that the direction of a main current of the IGBT is opposite to the forward direction of the diode.

Next, an ON operation of the free wheel diode will be described. When a forward bias (anode voltage $V_{AK}$) exceeding a prescribed threshold value is applied between the first and second electrode layers 21 and 22, holes are introduced from p type region 12 and electrons are introduced from n type cathode region 15, to n⁻ region 11. Thus, forward voltage $V_F$ significantly decreases and a current flows.

Figure 5:
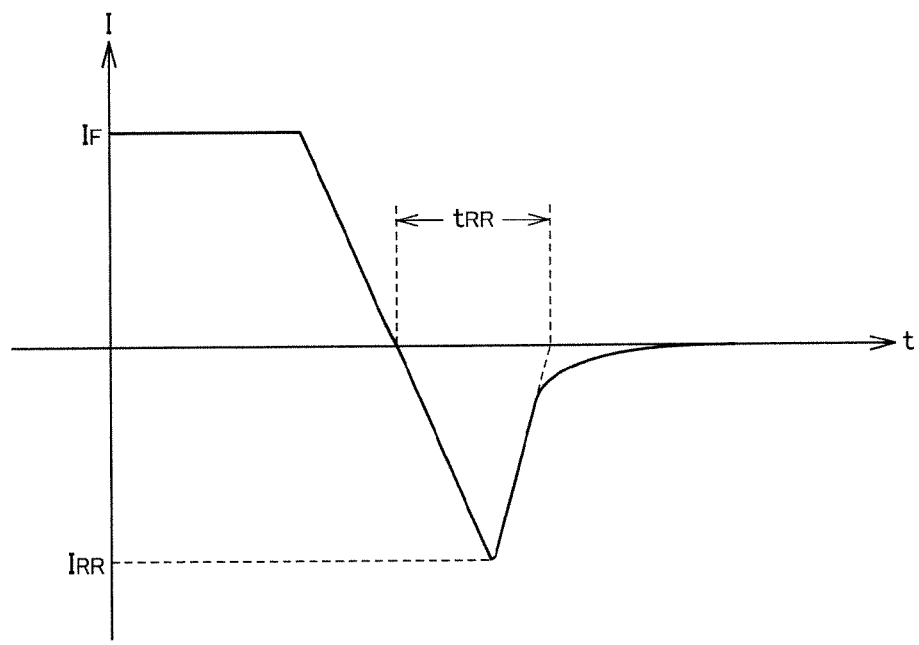
FIG. 5 is a graph schematically showing a current when the free wheel diode makes a transition from an on state to an off state.

Next, an OFF operation of the free wheel diode will be described. Referring to FIG. 5, in the on state, a forward voltage is applied to the free wheel diode (on state) and a forward current $I_F$ flows as a current I. When the voltage is switched to the reverse direction after time t (off state), a current in the direction opposite to $I_F$ and having a peak value $I_{RR}$ flows approximately for a time period $t_{RR}$ (recovery operation).

The peak value $I_{RR}$ is in proportion to temporal differentiation dI/dt of the current value when the current makes a transition from the forward direction to the reverse direction. To realize high-speed switching, it is necessary to increase dI/dt. In that case, however, the peak value $I_{RR}$ also increases.

Next, the function of outer peripheral region PR will be described. Outer peripheral region PR has the position of first main surface 41 where the first electrode layer 21 is not formed and p type region 12 electrically connected to the first electrode 21 is not formed, either. As such a region is provided on the outer periphery of the semiconductor device, breakdown voltage of the semiconductor device can be increased.

If outer peripheral region PR were not provided and the end portion of cell region CL were the end portion of semiconductor substrate 1, electric field concentration would occur at the end portion, and hence, the semiconductor device would have lower breakdown voltage.

Next, the method of manufacturing a semiconductor device in accordance with the present embodiment will be described with reference to FIGS. 6 to 13.

Figure 6:
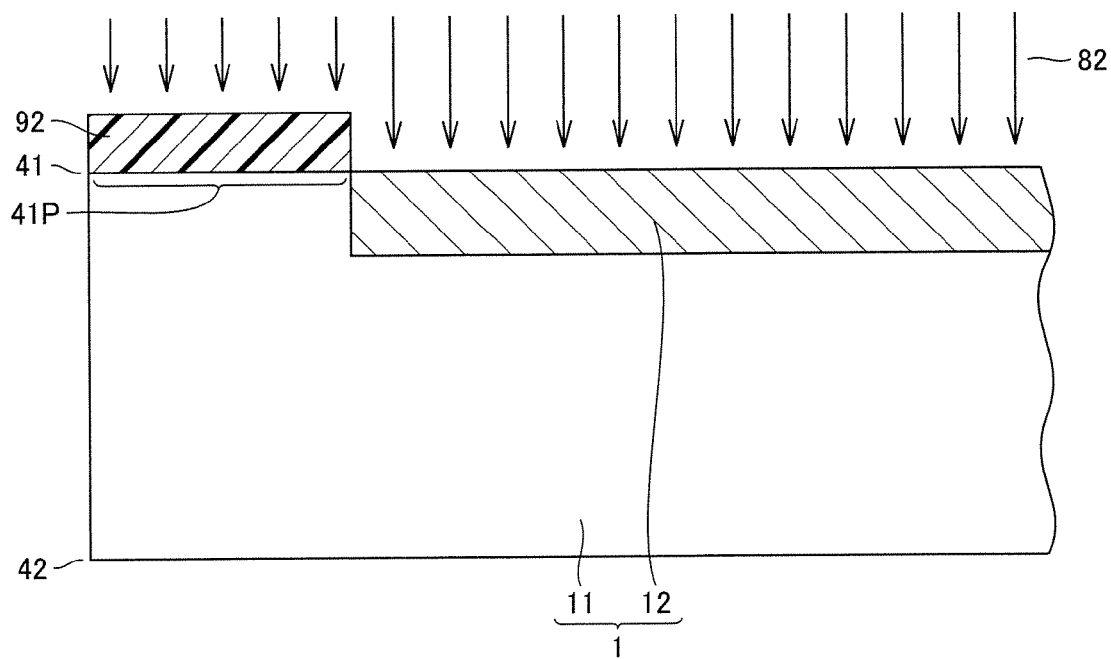
FIGS. 6 to 13 are schematic cross-sectional views successively showing first to eighth steps of manufacturing the semiconductor device in accordance with the first embodiment of the present invention, of which cross-sectional position corresponds to the cross-sectional position of FIG. 1.

Referring to FIG. 6, on outer peripheral surface 41P of semiconductor substrate 1 as a silicon substrate, for example, a resist 92 is formed selectively. Inside of semiconductor substrate 1 is n⁻ region 11, which is an n type semiconductor region having impurity concentration of $N_1 \pm 10\%$.

Thereafter, by ion implantation 82 to the first main surface 41 of semiconductor substrate 1, an impurity is selectively introduced to a portion where resist 92 is not formed. Thus, a p type region 12 surrounded by n⁻ region 11 is formed in the first main surface 41 of semiconductor substrate 1. Thereafter, resist 92 is removed. Activation of the introduced impurity may be done by a common method.

Figure 7:
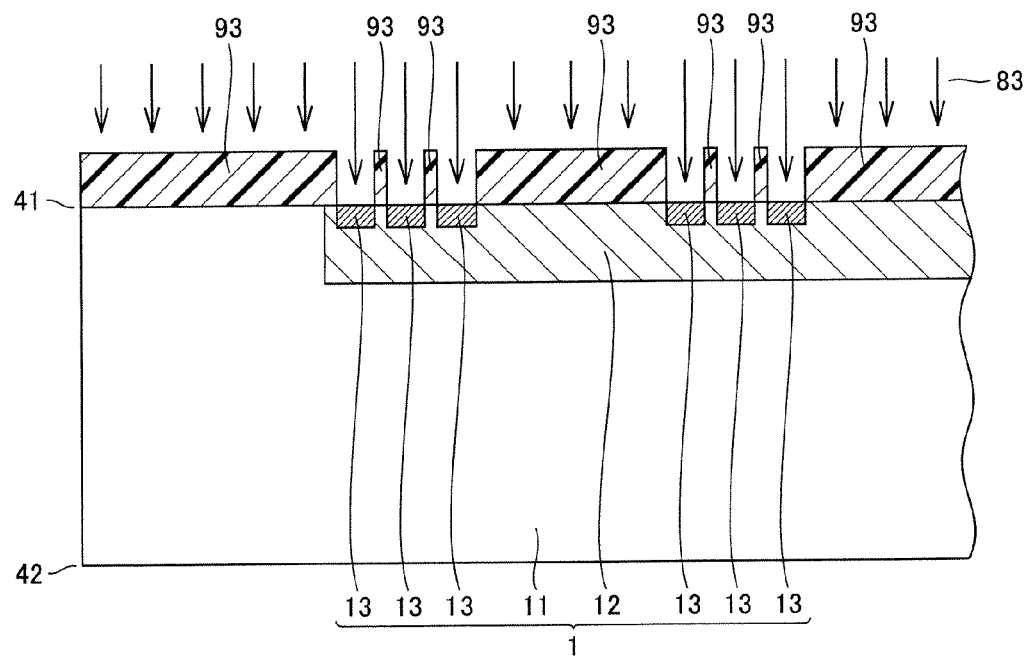

Referring to FIG. 7, on the first main surface 41 of semiconductor substrate 1, a resist 93 having a pattern is formed. At an opening of the pattern, a portion of p type region 12 is exposed. Further, at the first main surface 41, the opening is surrounded by p type region 12.

Thereafter, by ion implantation 83 to the first main surface 41 of semiconductor substrate 1, an impurity is selectively introduced to a region where resist 93 is not formed. By controlling the depth of ion implantation, n⁺ emitter region 13 of n type is formed in the first main surface 41 with a p type region (p type region 12) left at a lower portion. In this manner, n⁺ emitter region 13 of n type is formed in the first main surface within p type region 12, sandwiching p type region 12 with n⁻ region 11.

Thereafter, resist 93 is removed. Activation of the introduced impurity may be done by a common method.

Figure 8:
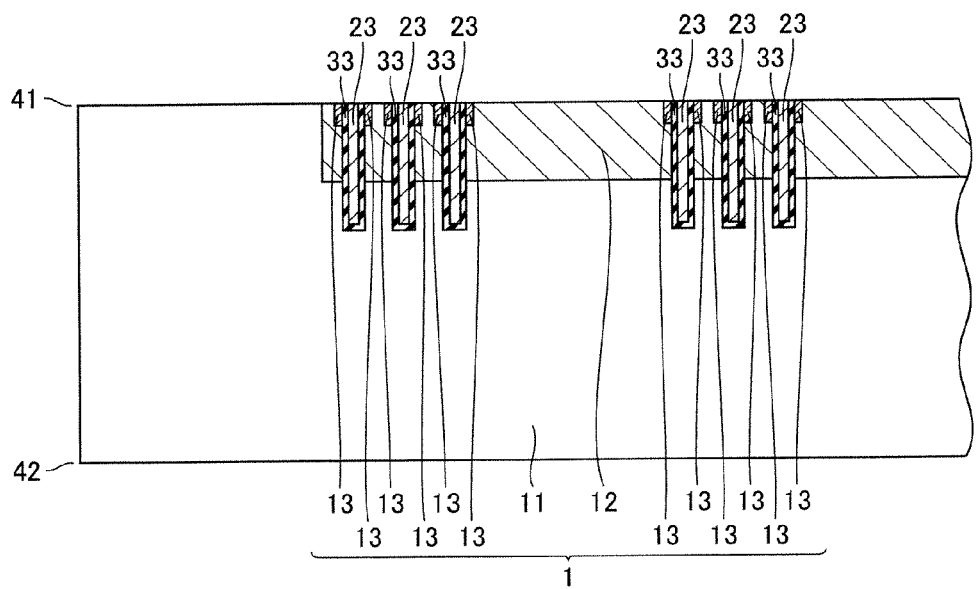

Referring to FIG. 8, in a region surrounded by n⁺ emitter region 13 at the first main surface 41 of semiconductor substrate 1, a trench deep enough to reach n⁻ region 11 is formed, for example, by dry etching. Thereafter, insulating film 33 is formed, for example, by thermal oxidation, to cover an inner wall portion of the trench. Thereafter, gate electrode layer 23 is formed to fill the trench.

Figure 9:
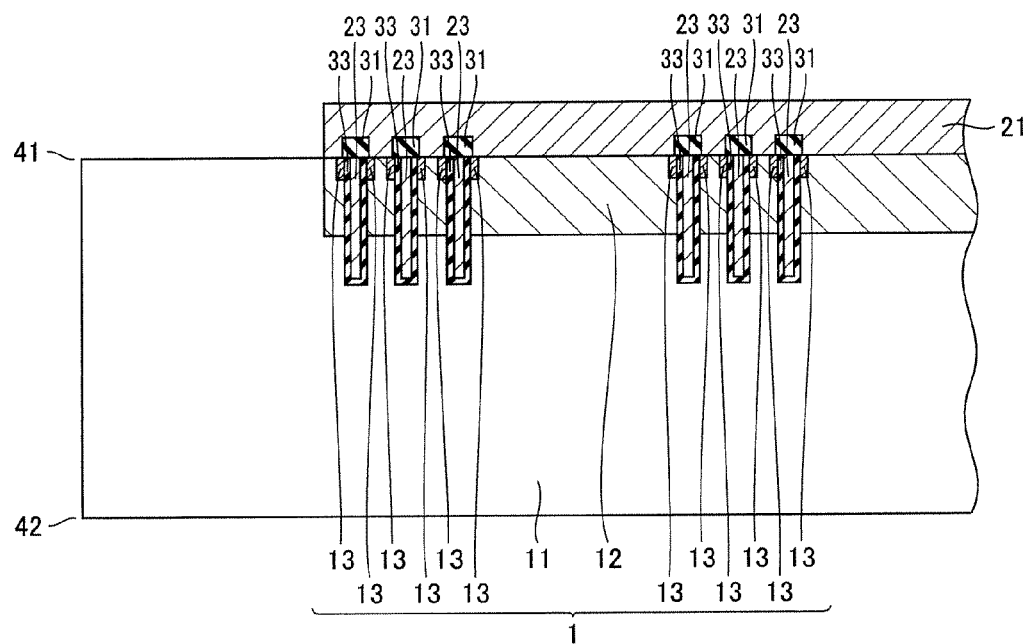

Referring to FIG. 9, insulating film 31 is formed to cover gate electrode layer 23 exposed on the first main surface 41 of semiconductor substrate 1. Thereafter, on the first main surface 41, the first electrode layer 21 is selectively formed. At this time, the first electrode layer 21 is in contact with and electrically connected to p type region 12 and n⁺ emitter region 13. The first electrode layer 21 is not formed on n⁻ region 11.

Figure 10:
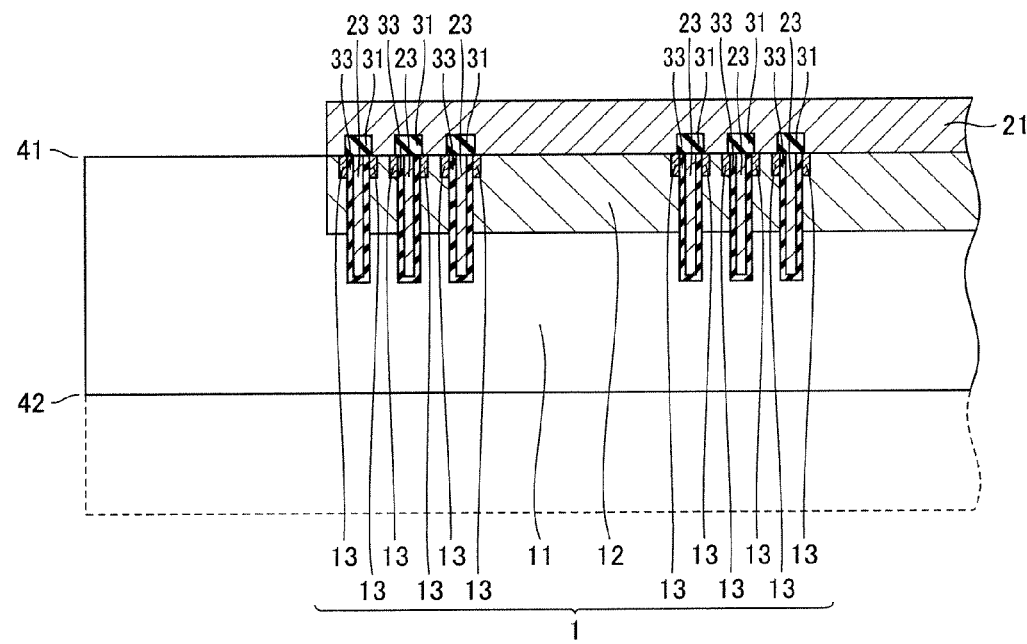

Referring to FIG. 10, semiconductor substrate 1 is polished on the side of the second main surface 42 as needed, so that the thickness of semiconductor substrate 1 is adjusted.

Figure 11:
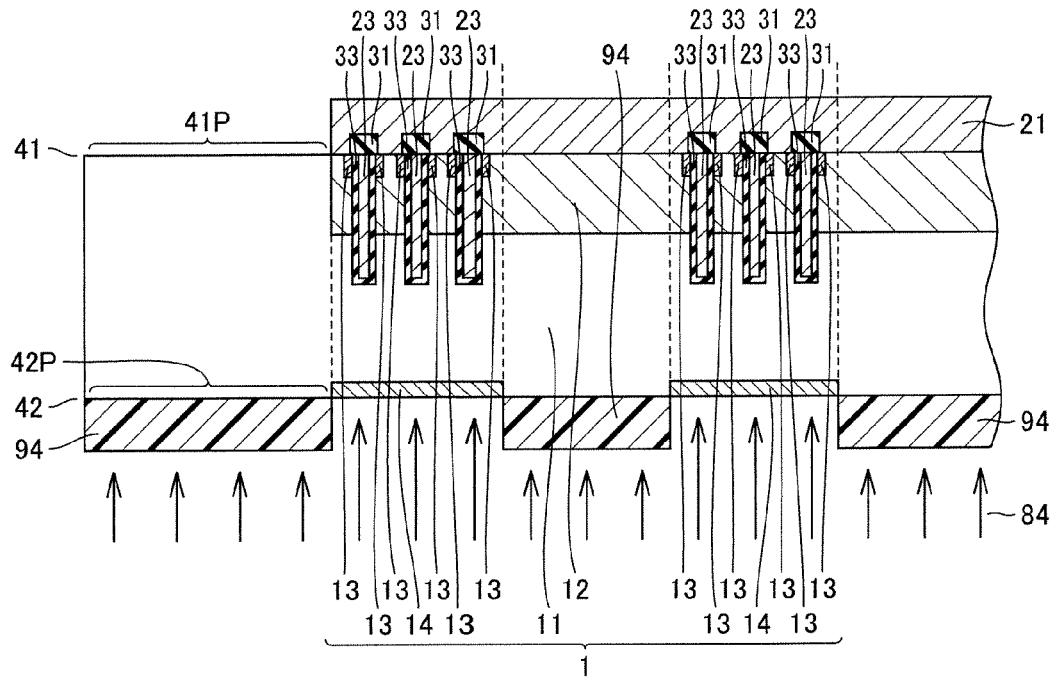

Referring to FIG. 11, on the second main surface 42 of semiconductor substrate 1, a pattern of resist 94 is formed. At this time, resist 94 is formed on the opposite surface 42P. Further, openings are formed in resist 94 at portions opposite to n⁺ emitter region 13 and insulating film 33. Thereafter, by ion implantation 84 to the second main surface 42 of semiconductor substrate 1, p type collector region 14 is formed. Then, resist 94 is removed.

Figure 12:
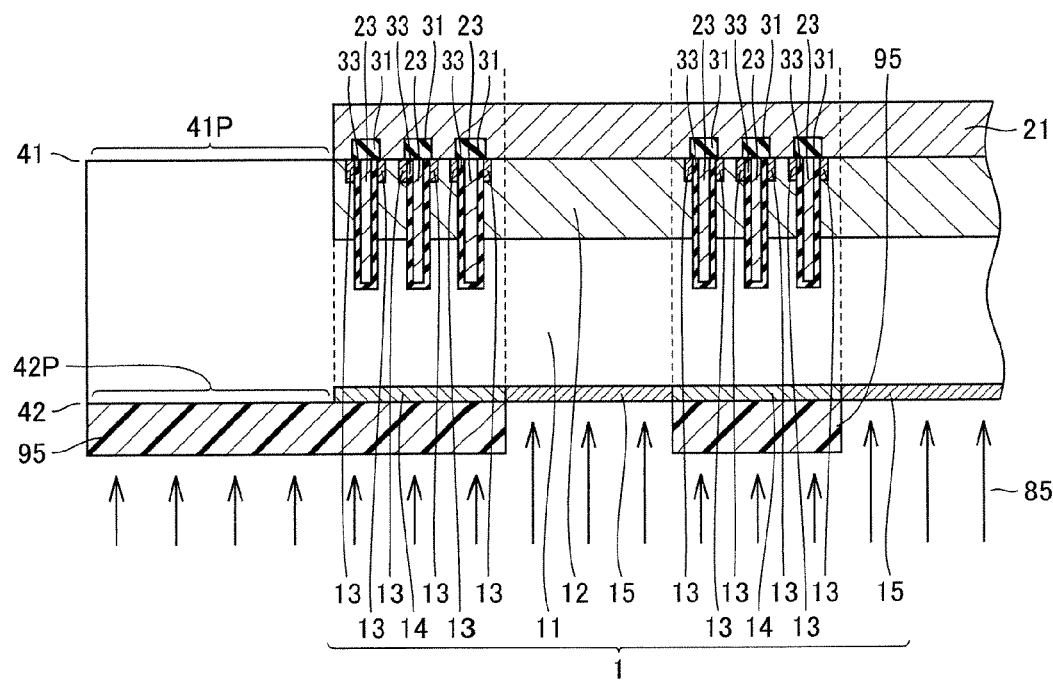

Referring to FIG. 12, on the second main surface 42 of semiconductor substrate 1, a pattern of resist 95 is formed. At this time, resist 95 is formed on the opposite surface 42P. Further, resist is also formed on portions opposite to n⁺ emitter region 13 and insulating film 33. As the pattern of resist 95, the pattern reverse to that of resist 94 shown in FIG. 11 may be used, except for the portion corresponding to the opposite surface 42P.

Thereafter, by ion implantation 85 to the second main surface 42 of semiconductor substrate 1, n type cathode region 15 is formed. Thereafter, resist 95 is removed.

Figure 13:
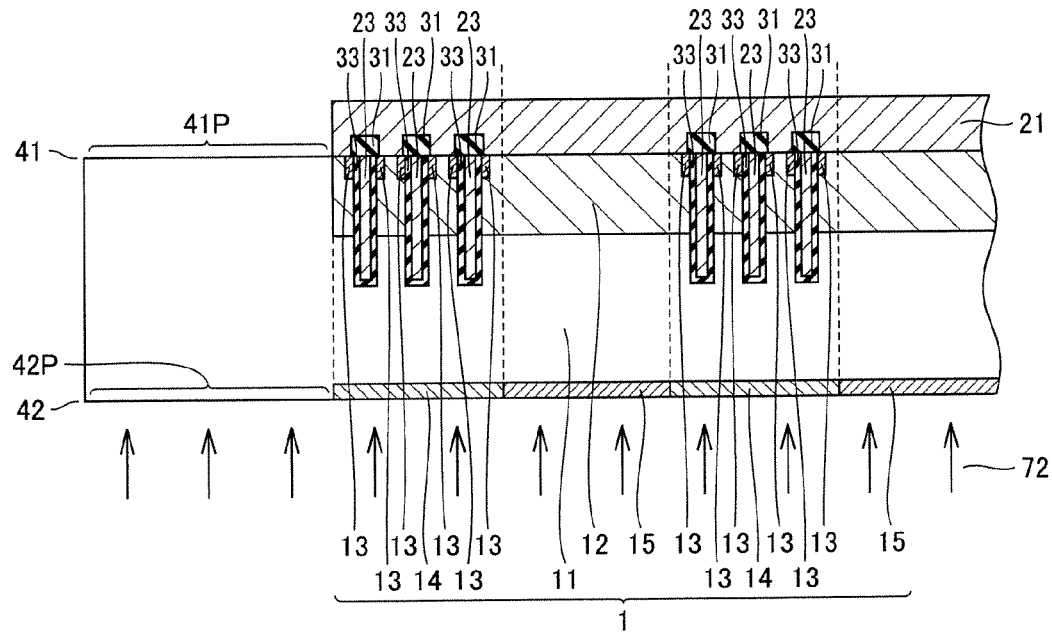

Referring to FIG. 13, the second main surface 42 of semiconductor substrate 1 is irradiated with a laser beam 72, for laser annealing, whereby thermal diffusion and activation of impurities are effected simultaneously both in p type collector region 14 and n type cathode region 15.

According to the present embodiment, to a surface (opposite surface 42P) of the second main surface at the outer peripheral region PR, ions are not implanted. Therefore, opposite surface 42P remains an n type semiconductor region having the impurity concentration of $N_1 \pm 10\%$. On the other hand, the surface on the side of the second main surface 42 of diode region DD is n type cathode region 15, of which impurity concentration is not lower than $100N_1$, as indicated at the region of d5 of FIG. 4. Namely, at the second main surface 42 of semiconductor substrate 1, the outer peripheral region PR has impurity concentration more than 2 orders of magnitude lower than at the diode portion DD. Therefore, to the outer peripheral region PR, carriers are not much supplied from the side of the second main surface, and hence, carriers are not much accumulated in the outer peripheral region PR.

Figure 14:
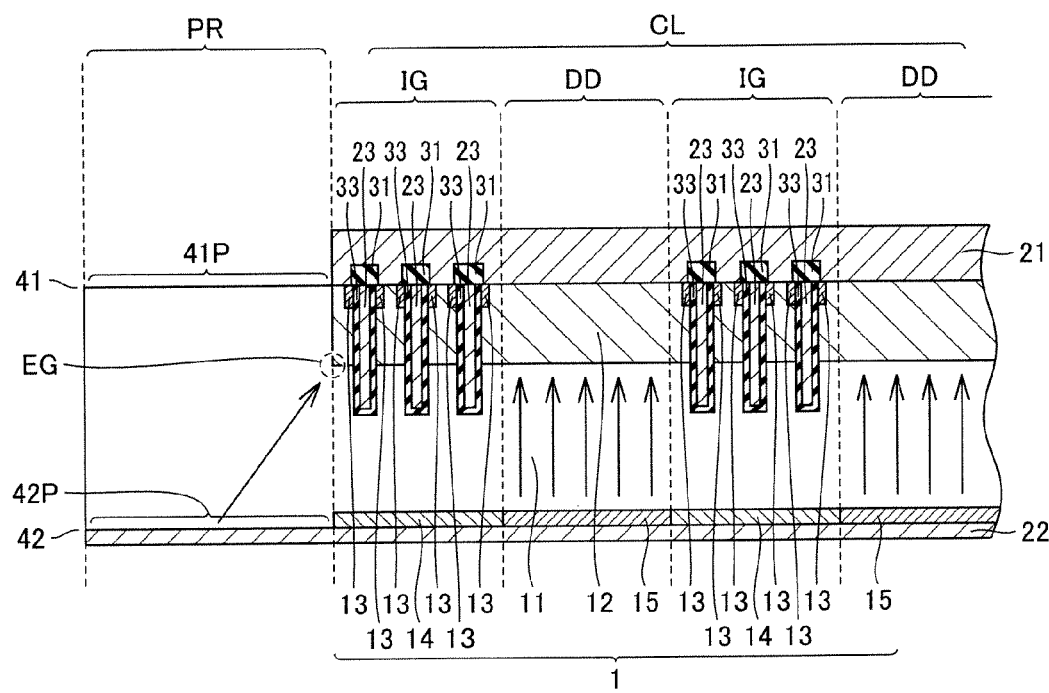
FIG. 14 is a partial cross-sectional view schematically showing how the current flows in a recovery operation of the semiconductor device in accordance with the first embodiment of the present invention.

As the carriers stored in the outer peripheral region PR is small in amount, the current (oblique arrow in FIG. 14) that tends to flow over the shortest path from the side of the second main surface 42 of outer peripheral region PR to cell region CL in the recovery operation of free wheel diode also becomes smaller. While the current tends to concentrate to the end portion (EG portion of FIG. 14) of p type region 12, its magnitude is smaller than the current flowing in the diode region DD (vertical arrow in FIG. 14). Therefore, breakdown of the semiconductor device (recovery breakdown) caused by excessively high current to the end portion of p type region 12 (EG portion of FIG. 14) can be prevented.

Figure 15:
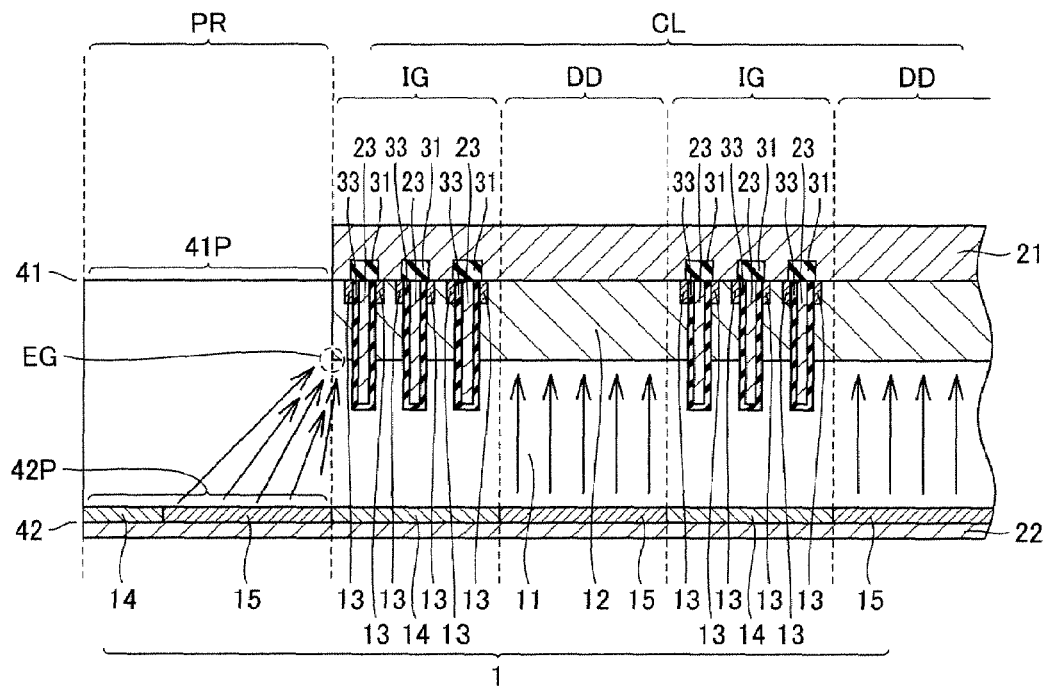
FIG. 15 is a partial cross-sectional view schematically showing how the current flows in a recovery operation of a free wheel diode of the semiconductor device, having an n-type cathode region formed on the second main surface side of the outer periphery, of a comparative example.

In a comparative example shown in FIG. 15, because of an n type impurity region of high concentration formed at the second main surface 42 at the outer peripheral region PR, carriers tend to accumulate in the outer peripheral region PR. As a result, the current concentrated to the EG portion in the recovery operation (oblique arrow in FIG. 15) increases, and the possibility of breakdown (recovery breakdown) of the semiconductor device increases.

In the present embodiment, p type collector region and n type cathode region 15 both extend in the same direction (lengthwise direction of FIG. 3) at the second main surface 42 of semiconductor substrate 1. Therefore, in semiconductor substrate 1, IGBT region IG and diode region DD can be arranged regularly, and hence, design of a semiconductor device can be facilitated.

Further, as shown in FIG. 3, p type collector region 14 is formed divided into a plurality of regions. When the semiconductor device functions as an IGBT, the current mainly flows not to the n type cathode region 15 but to p type collector region 14. As p type collector region is divided into a plurality of regions, the current is dispersed among the plurality of regions at the second main surface 42. Therefore, heat sources can be dispersed over semiconductor substrate 1, and local heat build-up of the semiconductor device can be prevented.

Further, as shown in FIG. 3, n type cathode region 15 is formed divided into a plurality of regions. When the semiconductor device functions as a free wheel diode, the current mainly flows not to p type collector region 14 but to n type cathode region 15. As the n type cathode region 15 is divided into a plurality of regions, the current is dispersed among the plurality of regions at the second main surface 42. Therefore, heat sources can be dispersed over semiconductor substrate 1, and local heat build-up of the semiconductor device can be prevented.

Further, as shown in FIG. 3, when p type collector regions 14 and n type cathode regions 15 are arranged alternately, p type collector regions 14 are positioned at opposite ends of the arrangement. Therefore, in the arrangement, n type cathode regions 15 are positioned sandwiched between p type collector regions 14. Therefore, it follows that IGBT region IG is in larger contact with the outer peripheral region PR than diode region DD. As a result, accumulation of carriers, supplied to $n^-$ region 11 when the diode of diode region DD is on, in the outer peripheral region PR can be reduced. As a result, it becomes possible to lower the peak value $I_{RR}$ (FIG. 5) in the recovery operation and to prevent recovery breakdown.

Further, as shown in FIG. 1, that portion of the second main surface 42 which is opposite to $n^+$ emitter region 13 is p type collector region 14. Therefore, the path through which electrons and holes are introduced to $n^-$ region 11 when the IGBT is on can be made the shortest. Thus, increase of on-resistance of the IGBT can be suppressed.

Further, as shown in FIG. 1, that portion of the first main surface 41 which is opposite to n type cathode region 15 is p type region 12. Therefore, the path through which electrons and holes are introduced to $n^-$ region 11 when the free wheel diode is on can be made the shortest. Thus, increase of forward voltage $V_F$ of the diode can be suppressed.

Further, as shown in FIG. 13, according to the method of manufacturing the semiconductor device in accordance with the present invention, p type collector region 14 and n type cathode region 15 are simultaneously subjected to laser annealing. Therefore, process steps can be reduced than when p type collector region 14 and n type cathode region 15 are thermally processed separately.

Second Embodiment

First, the structure of the semiconductor device in accordance with the present embodiment will be described.

Figure 16:
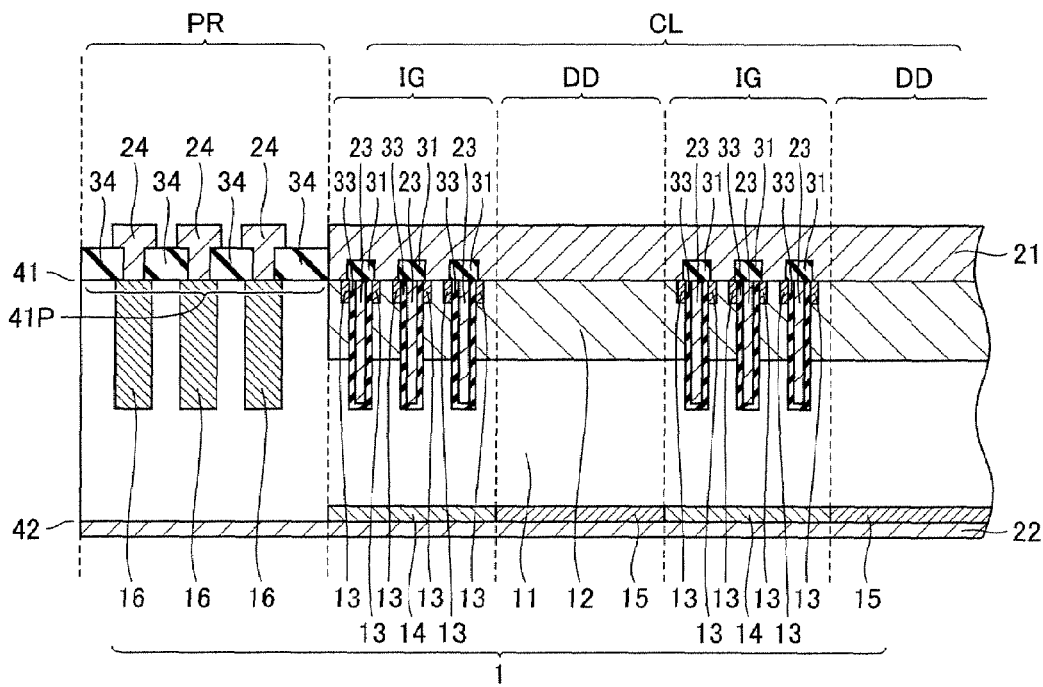
FIG. 16 is a partial cross-sectional view schematically showing a structure of a semiconductor device in accordance with a second embodiment of the present invention, taken along a line XVI-XVI of FIG. 17.
Figure 17:
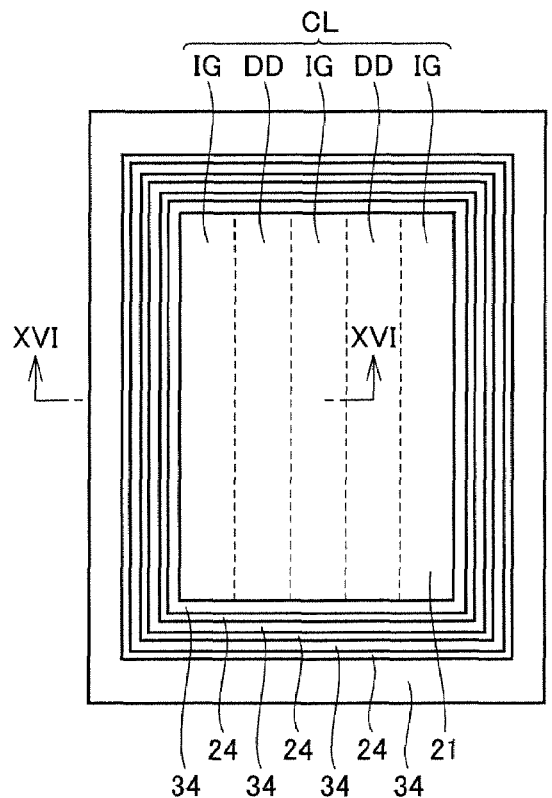
FIG. 17 is a top view schematically showing a structure of the semiconductor device in accordance with the second embodiment of the present invention.

Referring to FIGS. 16 and 17, the semiconductor device in accordance with the present invention includes a plurality of guard ring regions 16 formed at the outer peripheral surface 41P of semiconductor substrate 1, a plurality of guard electrode layers 24 formed on outer peripheral surface 41P, and an insulating film 34.

Guard ring region 16 is a p type region, which is arranged spaced from cell region CL. On guard ring region 16, guard electrode layer 24 formed of metal, for example, is provided. In order to prevent guard electrode layer 24 from being in contact with $n^-$ region 11, insulating film 34 is provided. Guard rings 16 and guard electrodes 24 are formed to surround cell region CL.

Except for these points, the structure of the present embodiment is the same as that of the first embodiment described above, and therefore, corresponding portions are denoted by the same reference characters and description thereof will not be repeated.

In FIGS. 16 and 17, an example is shown in which three-fold guard ring regions 16 and guard electrode layers 24 are provided to surround cell region CL. The numbers of the regions may be increased or decreased as needed.

Next, the method of manufacturing the semiconductor device in accordance with the present embodiment will be described with reference to FIGS. 18 to 20.

Figure 18:
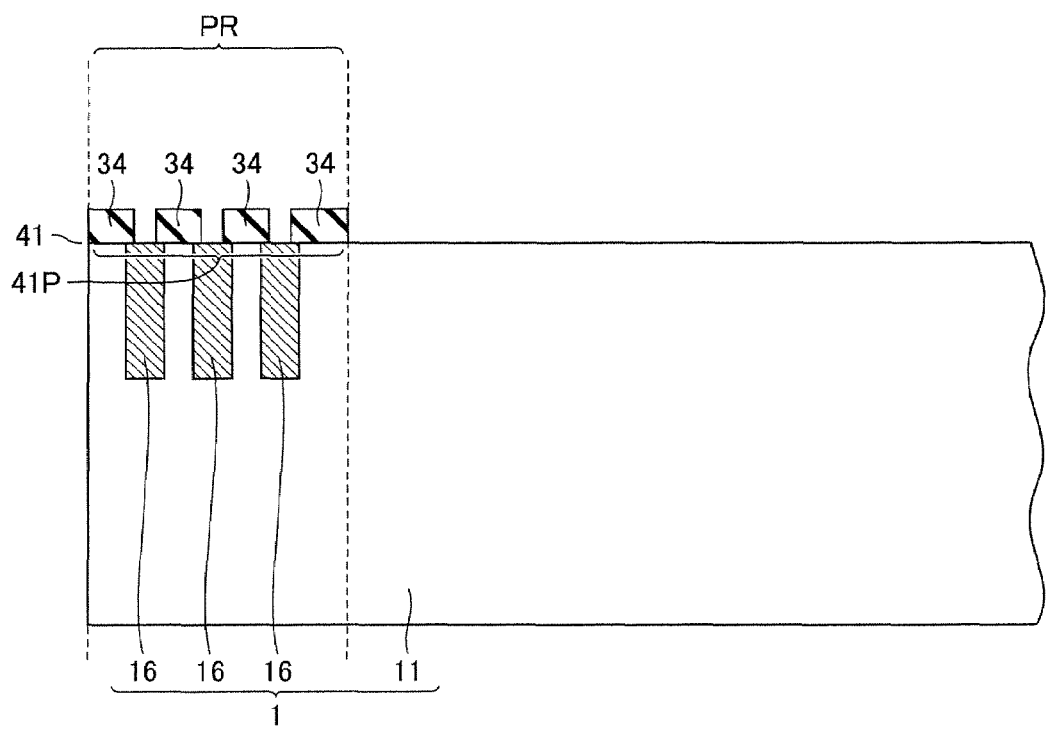
FIGS. 18 to 20 are schematic partial cross-sectional views successively showing the first to third steps of manufacturing the semiconductor device in accordance with the second embodiment of the present invention, of which cross-sectional position corresponds to the cross-sectional position of FIG. 16.

Referring to FIG. 18, by selective ion implantation to outer peripheral surface 41P of the first main surface 41 of semiconductor substrate 1 as a silicon substrate, for example, an impurity is introduced. Thus, three-fold p type guard ring regions 16 surrounding $n^-$ region 11 of n type are formed on the main surface 41. Activation of the introduced impurity may be done by a common method.

Thereafter, insulating film 34 is formed to cover a portion of outer peripheral surface 41P where $n^-$ region 11 is exposed, and to expose ring-shaped portions of guard ring regions 16.

Figure 19:
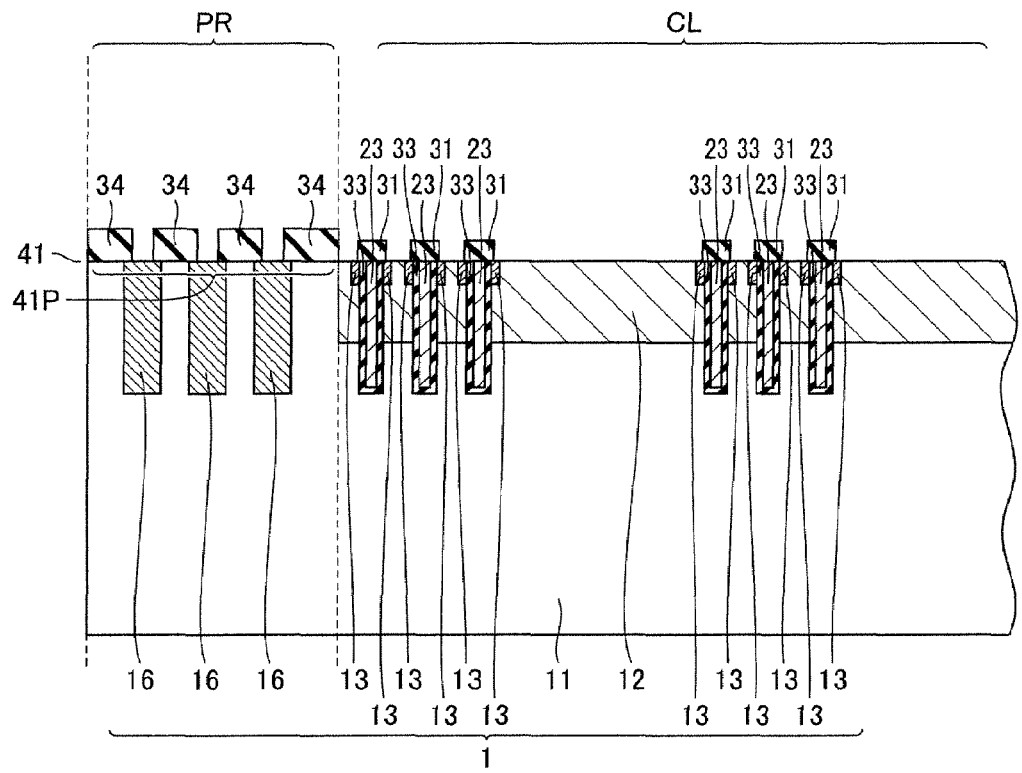

Referring to FIG. 19, in cell region CL surrounded by outer peripheral portion PR, p type region 12, $n^+$ emitter region 13, insulating film 33, and gate electrode layer 23 are formed. These components are formed through the same process steps as those of the first embodiment shown in FIGS. 6 to 8 (first to third steps).

Thereafter, insulating film 31 is formed to cover gate electrode layer 23 exposed on the first main surface 41 of semiconductor substrate 1. Further, insulating film 33 is formed to cover $n^-$ region 11 exposed at outer peripheral surface 41P. Insulating films 33 and 34 may be formed simultaneously.

Figure 20:
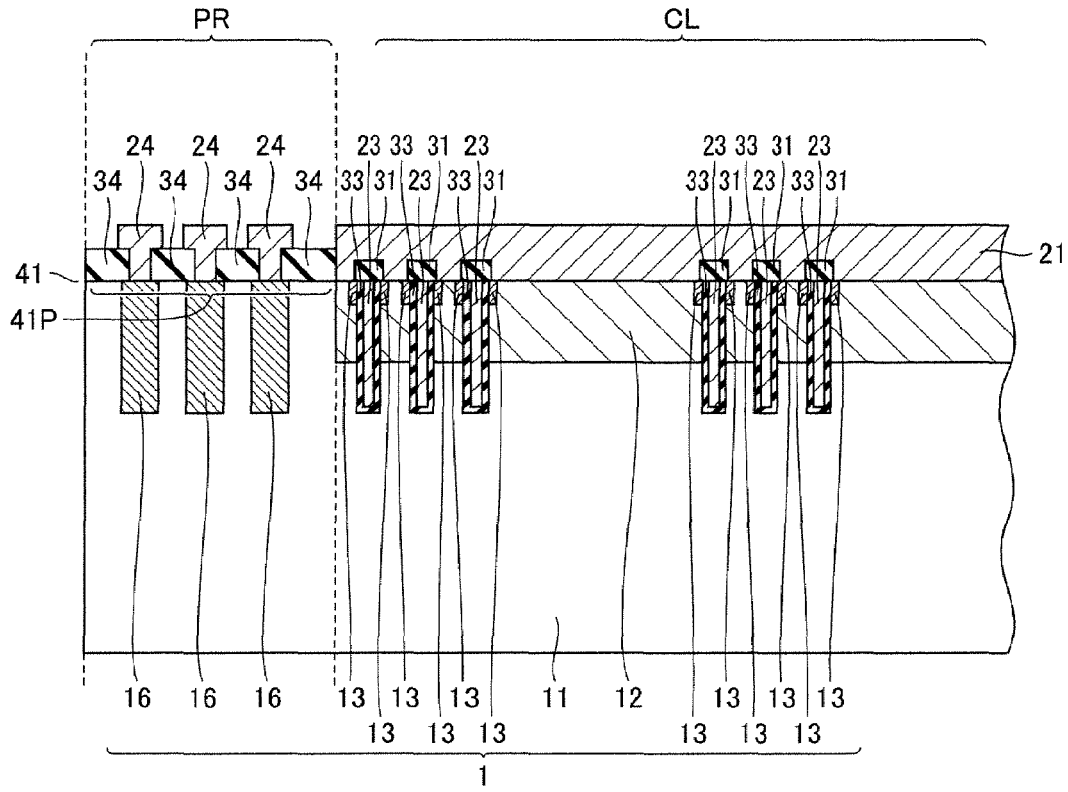

Referring to FIG. 20, on the side of first main surface 41 of cell region CL, the first electrode layer 21 is formed. Further, entirely over guard ring regions 16, guard electrode layers 24 are formed. Similar to guard ring regions 16, three-fold guard electrode layers 24 are formed to surround the cell region CL. The first electrode layer 21 and guard electrode layers 24 may be formed simultaneously.

Thereafter, through the same steps as shown in FIGS. 10 to 13 (the fifth to eighth steps) of the first embodiment, the semiconductor device (FIG. 16) of the present embodiment is completed.

According to the present invention, p type guard ring regions 16 are formed on the outer peripheral surface 41P as shown in FIG. 16. When a voltage is applied between the first and second electrode layers 21 and 22, at the pn junction portion formed by the guard ring region 16 and n⁻ region 11, a depletion layer is formed to surround the cell region CL. Thus, breakdown voltage of the semiconductor device can be increased.

Further, guard electrode layer 24 formed of metal, for example, is formed on guard ring region 16. Therefore, the potential of guard ring region 16 as a whole can be made uniform, and the function of guard ring region 16 described above can be enhanced.

Third Embodiment

Figure 21:
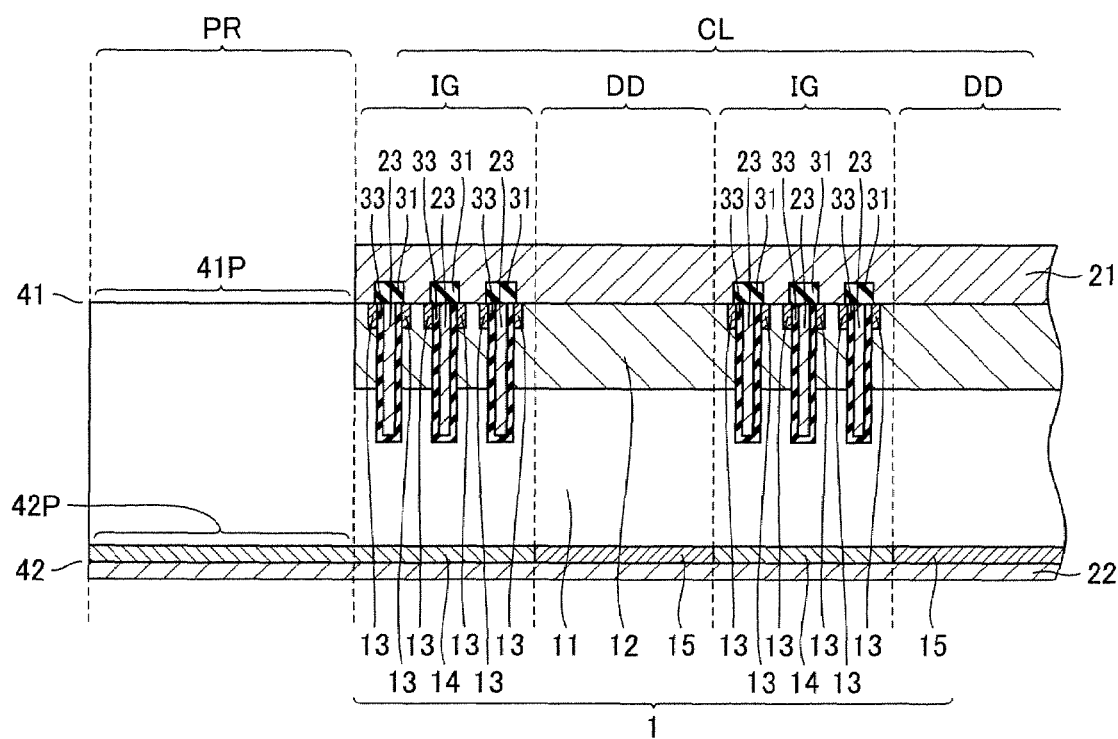
FIG. 21 is a partial cross-sectional view schematically showing a structure of a semiconductor device in accordance with a third embodiment of the present invention.

Referring to FIG. 21, in the semiconductor device in accordance with the present invention, a p type collector region 14 is formed at the opposite surface 42P.

Except for this point, the structure of the present embodiment is the same as that of the first embodiment and, therefore, corresponding portions are denoted by the same reference characters and description thereof will not be repeated.

According to the present embodiment, opposite surface 42P is a p type impurity region. The second main surface 42 of diode region DD is an n type impurity region. Therefore, in the diode region DD, a pn structure is provided from n type cathode region 15 to p type region 12, while a pnp structure is provided from opposite surface 42P to p type region 12. Therefore, even when the diode is on, carriers are not supplied from opposite surface 42P to outer peripheral region PR. Therefore, the current flowing from outer peripheral region PR to cell region CL (oblique arrow of FIG. 14) in the recovery operation of the first embodiment can further be reduced, and recovery breakdown can be suppressed.

In all embodiments described above, p and n conductivity types may be reversed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having first and second main surfaces and including a first impurity region of a first conductivity type;
   a second impurity region of a second conductivity type formed in said first main surface of said semiconductor substrate and surrounded by said first impurity region at said first main surface;
   a third impurity region of the first conductivity type formed in said first main surface and sandwiching said second impurity region with said first impurity region;
   a fourth impurity region of the second conductivity type selectively formed in said second main surface of said semiconductor substrate and sandwiching said first impurity region with said second impurity region;
   a fifth impurity region of the first conductivity type having higher impurity concentration than said first impurity region, selectively formed in said second main surface of said semiconductor substrate and sandwiching said first impurity region with said second impurity region; and
   a control electrode layer formed to be opposite to said second impurity region, sandwiched between said first impurity region and said third impurity region, with an insulating layer interposed; wherein
   that portion of said second main surface, which is opposite to a portion of said first main surface where said first impurity region is formed, is in the peripheral regions of the semiconductor device, surrounds regions for forming said fourth and fifth impurity regions, formed alternatively on said second main surface, and is a region of a second conductivity type.

2. The semiconductor device according to claim 1, further comprising
   a sixth impurity region of the second conductivity type, surrounding said second impurity region at said first main surface, with said first impurity region interposed.

3. The semiconductor device according to claim 2, further comprising
   a guard electrode layer formed on the first main surface of said semiconductor substrate and electrically connected to said sixth impurity region.

4. The semiconductor device according to claim 1, wherein
   said fourth impurity region is positioned at that portion of said second main surface which is opposite to said third impurity region.

5. The semiconductor device according to claim 1, wherein said fourth impurity region and said fifth impurity region extend in a same direction at said second main surface.

6. The semiconductor device according to claim 5, wherein said fourth impurity regions have a plurality of regions of the second conductivity type by which said fifth impurity region is sandwiched at said second main surface.

7. A method of manufacturing a semiconductor device, comprising the steps of:
   to a first main surface of a semiconductor substrate having said first main surface and a second main surface and having a first impurity region of a first conductivity type, selectively introducing an impurity to form a second impurity region of a second conductivity type surrounded by said first impurity region at said first main surface;
   forming a third impurity region of the first conductivity type on said first main surface in said second impurity region, to sandwich said second impurity region with said first impurity region;
   forming a control electrode layer to be opposite to said second impurity region, sandwiched between said first impurity region and said third impurity region, with an insulating film interposed;
   selectively forming a fourth impurity region of the second conductivity type in said second main surface; and
   selectively forming a fifth impurity region of the first conductivity type having higher impurity concentration than said first impurity region at a portion of said second main surface opposite to said second impurity region, and forming a portion of said second main surface, which is in the peripheral regions of the semiconductor device and opposite to a portion of said first main surface where said first impurity region is formed, so that it surrounds regions for forming said fourth and fifth impurity regions, formed alternatively on said second main surface, and is a region of a second conductivity type.

8. The method of manufacturing a semiconductor device according to claim 7, wherein
   said second main surface is thermally processed after firming said fourth and fifth impurity regions.

* * * * *